United States Patent
Feichtinger et al.

(10) Patent No.: US 7,449,405 B2
(45) Date of Patent: Nov. 11, 2008

(54) METHOD FOR PRODUCING BUMPS ON AN ELECTRICAL COMPONENT

(75) Inventors: Thomas Feichtinger, Graz (AT); Günther Pudmich, Köflach (AT)

(73) Assignee: EPCOS AG (DE)

( * ) Notice: Subject to any disclaimer, the term of this patent is extended or adjusted under 35 U.S.C. 154(b) by 159 days.

(21) Appl. No.: 11/252,141

(22) Filed: Oct. 17, 2005

(65) Prior Publication Data
US 2006/0057830 A1 Mar. 16, 2006

Related U.S. Application Data

(63) Continuation of application No. PCT/DE2004/000769, filed on Apr. 14, 2004.

(30) Foreign Application Priority Data
Apr. 16, 2003 (DE) ................. 103 17 596

(51) Int. Cl.
*H01L 21/44* (2006.01)
(52) U.S. Cl. ................. 438/612; 257/E21.514
(58) Field of Classification Search ................. 438/612, 438/164, 174, 611, 93; 257/E21.514
See application file for complete search history.

(56) References Cited

U.S. PATENT DOCUMENTS 6,380,061 B1 4/2002 Kobayashi et al.
6,620,731 B1 * 9/2003 Farnworth et al. .......... 438/667
2002/0094604 A1 * 7/2002 Hayama et al. ............. 438/108
2003/0160310 A1 * 8/2003 Langhorn ................... 257/678
2003/0178747 A1 * 9/2003 Bast et al. ............... 264/272.11

FOREIGN PATENT DOCUMENTS

| DE | 19634488 A1 | 3/1998 |
| DE | 10018377 C1 | 12/2001 |
| DE | 10159544 A1 | 6/2003 |
| EP | 1239514 A2 | 9/2002 |

OTHER PUBLICATIONS

H. Schaumburg "Keramik", B.G. Teubner Verlag Stuttgart, 1994, pp. 351 to 352 and 563.

* cited by examiner

*Primary Examiner*—Scott B. Geyer
*Assistant Examiner*—Seahvosh J Nikmanesh
(74) *Attorney, Agent, or Firm*—Mayback & Hoffman, P.A.; Gregory L. Mayback; Scott D. Smiley

(57) ABSTRACT

A method for producing contacts in the form of bumps on a component that comprises a base body includes, first, positioning a template on the base body. Through holes are produced through the template. By filling the through holes with an electrically conductive material and subsequently hardening, fillers are produced. Bumps for the external electrical contact of the fillers are, then, produced directly on the surfaces of the fillers.

21 Claims, 2 Drawing Sheets

METHOD FOR PRODUCING BUMPS ON AN ELECTRICAL COMPONENT

CROSS-REFERENCE TO RELATED APPLICATION

This is a continuing application, under 35 U.S.C. § 120, of copending international application No. PCT/DE2004/000769, filed Apr. 14, 2004, which designated the United States; this application also claims the priority, under 35 U.S.C. § 119, of German patent application No. 103 17 596.2, filed Apr. 16, 2003; the prior applications are herewith incorporated by reference in their entirety.

BACKGROUND OF THE INVENTION

Field of the Invention

In semiconductor components, solder balls (bumps) are frequently used for mounting the components on substrates. In such a case, the components are typically mounted using bumps on the substrate in flip-chip construction, contact surfaces for electrically conductive contact of the bumps frequently being provided on the substrate. In the semiconductor components, the uppermost metal layer that is in contact with the bumps is frequently aluminum or a related metal. Because of an electrically insulating aluminum oxide layer present on the aluminum, and because of the non-wetting wetting properties of aluminum to solders, different further metal layers frequently must be positioned between the bumps and the metal layer of the semiconductor component. These layers ensure, for example, good adhesion of the bumps and may be wetted by the material of the bumps. This "under-bump metallization" (UBM) frequently is applied to the semiconductor chip using complex galvanic or other methods. In such a case, the production of the under-bump metallization causes a high outlay in labor and, therefore, cost.

SUMMARY OF THE INVENTION

It is accordingly an object of the invention to provide a method for producing bumps on an electrical component that overcomes the hereinafore-mentioned disadvantages of the heretofore-known devices and methods of this general type and in which the above-mentioned under-bump metallization is not necessary and, simultaneously, the bumps may be produced especially easily on an electrical component.

With the foregoing and other objects in view, there is provided, in accordance with the invention, a method for producing electrical contacts in the form of bumps on an electrical component including a base body, the method including the steps of (A) positioning a template on a surface of the base body of the electrical component, (B) producing through holes in the base body through the template, (C) filling the through holes with an electrically conductive material to a level higher than the surface of the base body to form fillers in the through holes, (D) hardening the fillers to have surfaces of the fillers project out of the base body, and (E) producing bumps directly on the surfaces of the fillers for an external electrical contact of the fillers. Through holes are also referred to in the art as vias.

With the objects of the invention in view, there is also provided a method for producing electrical contacts on an electrical component including a base body, the method including the steps of, first, positioning a template on a surface of the base body, second, producing through holes in the base body through the template, third, forming fillers in the through holes by filling the through holes with an electrically conductive material to a level higher than the surface of the base body, fourth, hardening the fillers to have filler surfaces project out of the base body, and, fifth, producing bumps directly on the projecting filler surfaces for externally electrically contacting the fillers.

With the objects of the invention in view, there is also provided a method for producing electrical contacts on an electrical component, the method including the steps of, first, providing the electrical component with a base body of a ceramic green body, second, producing a plurality of electrode surfaces positioned at intervals with respect to one another in the base body, the electrode surfaces containing electrodes, third, positioning a polymer template having openings on a surface of the base body, fourth, producing through holes in the base body through at least some of the openings of the template, fifth, forming fillers in the through holes by filling the through holes with an electrically conductive material to a level higher than the surface of the base body and electrically conductively connecting the fillers to the electrodes, sixth, hardening the fillers to have filler surfaces project out of the base body and simultaneously sintering the ceramic green body, and, seventh, producing bumps directly on the projecting filler surfaces for externally electrically contacting the fillers.

The present invention describes a method for producing electrical contacts in the form of bumps on an electrical component, including a base body, the method steps including, in step A), positioning a template on a base body of the electrical component. Subsequently, in step B), through holes are produced through the template. Then, by filling the through holes with an electrically conductive material to a higher level than the surface of the base body, fillers are produced (step C). In step D), the fillers are, then, hardened, these fillers projecting out of the base body of the electrical component. In step E), bumps are produced directly on the surfaces of the fillers for the external electrical contact of the fillers.

The method according to the present invention specifies an especially simple method for externally contacting regions located in the interior of the component in an electrically conductive way using the bumps. The template positioned on the base body is used for the purpose of mechanically stabilizing the base body during the production of the through holes in this case so that no fractures occur in the base body. Simultaneously, in step C) of the method according to the present invention, the template allows the electrically conductive material to be poured into the through holes to above the surface of the base body so that, in step D), upon the hardening, the fillers project above the base body of the electrical component. Then, the bumps may be directly produced especially easily on these projecting surfaces of the fillers (see, for example, FIGS. 1A through 1D). In such a case, no under-bump metallizations are necessary between the fillers and the bumps.

In accordance with another mode of the invention, in step (A), a template having openings is used and the through holes are produced subsequently through the openings in step (B).

In such a case, the template is used as a matrix for producing the through holes and specifies the position of the through holes in the base body at the same time so that especially simple production of the through holes is possible.

In accordance with a further mode of the invention, it is possible for a ceramic green body to be used for the electrical component, this advantageously then being sintered together with the fillers in step (D). The sintering of the green body may be performed at approximately 1000° C. to 1200° C.

Therefore, the green body is sintered and the fillers are simultaneously hardened especially advantageously in one step.

In accordance with an added mode of the invention, the template that includes a polymer material is used. This may be, for example, a plastic, such as polyphenylene sulfide (PPS) or polyethylene terephthalate (PET). The template is advantageously an organic film of high rigidity, which mechanically stabilizes the base body and may be stamped favorably at the same time. The template is especially advantageously vaporized during the hardening of the fillers in step D) and a possibly occurring sintering of the ceramic green body so that it dissolves during this step. In such a case, the template may still hold the fillers, which are not yet hardened, in the through holes at the beginning of the hardening step, but is, then, removed using vaporization, however, so that subsequent pulling off of the film is no longer necessary. Vaporization as defined in the present invention is also understood to include carbonization.

In accordance with an additional mode of the invention, in step (B), the through holes may be produced advantageously using stamping. Stamping allows especially simple and cost-effective production of the through holes.

In accordance with yet another mode of the invention, prior to the positioning step, a plurality of electrode surfaces positioned at intervals with respect to one another are produced in the base body, the electrode surfaces containing electrodes, and the filling and hardening steps are carried out to electrically conductively connect the fillers to the electrodes. Regions of the base body are located between each of the electrodes. The fillers may, then, be produced such that they are connected to the electrodes in an electrically conductive way. The advantage is that the fillers are, then, used as the electrically conductive through contacts, which connect the electrodes to the bumps on the surface of the component in an electrically conductive way. These electrodes allow the resistance, the capacitance, and also other electrical properties of the component to be varied arbitrarily.

In accordance with yet a further mode of the invention, the base body is formed by stacking ceramic green films one on top of another. In such a case, the electrodes may be produced on individual ceramic green films. This is made possible especially easily using printing methods, such as the screen printing method. However, it is also possible to first produce the through holes in one single ceramic green film before the base body is produced having this green film as the uppermost layer by stacking the films one on top of another.

In accordance with yet an added mode of the invention, in a step (D1) between steps (D) and (E), the projecting surfaces of the fillers may be treated mechanically and/or chemically. This treatment may be used especially advantageously for the purpose of achieving better wettability of the surfaces of the fillers for the bumps. Mechanical treatment may be performed using lapping and sandblasting, for example. Chemical treatment may be performed by acids and bases.

In accordance with yet an additional mode of the invention, metal pastes that include Pd, Pt, AgPd, AgPt, and AgPdPt as metals and metal alloys are favorably used as the electrically conductive material in step C). These metals and metal alloys allow especially good wettability and adhesion of the bumps on the electrically conductive fillers.

In accordance with again another mode of the invention, in step (E), the bumps may be produced using a galvanic method, for example. It is also possible to produce bumps especially easily in step E) by bringing the surfaces of the fillers in contact with a solder bath.

In accordance with again a further mode of the invention, in step (E), the following metals and metal alloys may be used advantageously for the bumps: Sn, SnPb, SnAgCu, SnAgCuBi, SnZn, and SnAg. The metals and/or metal alloys are especially well suitable for being applied to the fillers using a soldering method.

In accordance with a concomitant mode of the invention, the base body is of a ceramic material selected from ferrites, ZnO—Bi, ZnO—Pr, NPO ceramics, doped BaTiO3, nickel-manganese spinel, and/or perowskite. A base body that includes a ceramic material that represents a varistor ceramic based on ZnO—Bi or ZnO—Pr may be used in the method according to the present invention. Such an electrical component, manufactured using the method according to the present invention, would, then, be a varistor that may be used as a voltage-dependent resistor for the overvoltage fuse of circuits, for example. The ceramic material of the base body may also include a capacitor ceramic that is selected from NPO ceramics, such as (Sm, Pa) $NiCdO_3$. These ceramics have temperature-dependent $\epsilon_R$ values and are not ferroelectric ceramics. Furthermore, ferroelectric ceramics having high dielectric constants, as well as doped barium titanate and barrier layer ceramics, may be used. All of these dielectric ceramics are described in the book "Keramik [Ceramics]" by H. Schaumburg (Editor, B. G. Teubner Verlag Stuttgart, 1994) on pages 351 through 352 and 363, reference hereby being made to these pages in their entirety. In addition, the ceramic material may be selected from thermistor ceramics, such as NTC ceramics, for example, nickel-manganese spinels and perowskite. Furthermore, ferrites, as well as dielectric, non-ceramic materials, such as glasses, may be used as materials for the base body in the method according to the present invention.

Other features that are considered as characteristic for the invention are set forth in the appended claims.

Although the invention is illustrated and described herein as embodied in a method for producing bumps on an electrical component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
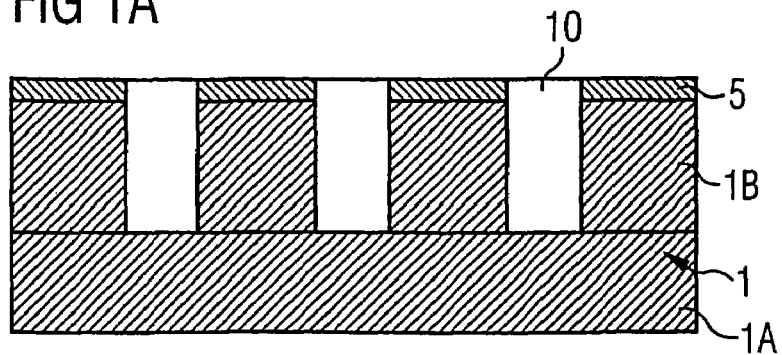
FIG. 1A is a diagrammatic, fragmentary, cross-sectional view of an electrical component after a step of the method according to the present invention.

The method of the present invention produced electrical contacts in the form of bumps on an electrical component having a base body. A template is positioned on a base body of the electrical component (step A). Subsequently, (step B), through holes are produced through the template. Then, fillers are produced by filling the through holes with an electrically conductive material to a higher level than the surface of the base body (step C). The fillers are, then, hardened (step D), these fillers projecting out of the base body of the electrical component. Bumps are produced (step E) directly on the surfaces of the fillers for the external electrical contact of the fillers.

This method is especially simple for externally contacting regions located inside the component in an electrically conductive way using the bumps. The template positioned on the base body mechanically stabilizes the base body during the production of the through holes so that no fractures occur therein. Simultaneously, in step C) of the method, the template allows the electrically conductive material to be poured into the through holes to a level above the surface of the base body so that, in step D), upon hardening, the filling material projects above the base body. Then, the bumps are directly produced on the projecting surfaces. Thus, no under-bump metallizations are necessary between the fillers and the bumps.

In an advantageous variant of step A), a template having openings is used and the through holes are produced subsequently through the openings in step B). Here, the template is used as a matrix for producing the through holes and simultaneously specifies the position of the through holes in the base body to make possible simple production of the through holes.

It is possible for a ceramic green body to be used for the electrical component, which is, then, sintered together with the fillers in step D). The sintering of the green body may be performed at 1000° C. to 1200° C. Accordingly, the green body is sintered simultaneously with hardening of the fillers.

If the template includes a polymer material, the template is vaporized during the hardening of the fillers in step D) (and possibly sintering of the ceramic green body). In such a case, the template may still hold the not-yet-hardened fillers in the through holes at the beginning of the hardening step, but is, then, removed using vaporization. Such a variant removes the need to have a subsequent pulling off of the film.

In step B), the through holes may be produced using stamping, which allows especially simple and cost-effective production of the through holes.

Before step A), it is possible to produce multiple electrode surfaces positioned at intervals in the base body, which contain the electrodes. Then, regions of the base body are located between each of the electrodes. The fillers may, then, be produced to be electrically conductively connected to the electrodes.

In a further embodiment, the base body can be formed by stacking ceramic green films one on top of another. In such a case, the electrodes may be produced on individual ceramic green films. This is made possible especially easily using printing methods, such as the screen printing method. However, it is also possible to first produce the through holes in one single ceramic green film before the base body is produced having this green film as the uppermost layer by stacking the films one on top of another.

Between steps D) and E), the projecting surfaces of the fillers may be treated mechanically and/or chemically. Such a treatment may be used especially advantageously for the purpose of achieving better wettability of the surfaces of the fillers for the bumps.

In step C), metal pastes that include Pd, Pt, AgPd, AgPt, and AgPdPt as metals and metal alloys are favorably used as the electrically conductive material.

In step E), the bumps may be produced using a galvanic method, for example. It is also possible to produce bumps especially easily in step E) by bringing the surfaces of the fillers in contact with a solder bath.

In step E), the following metals and metal alloys may be used advantageously for the bumps: Sn, SnPb, SnAgCu, SnAgCuBi, SnZn, and SnAg. The metals and/or metal alloys are especially well suited for being applied to the fillers using a soldering method.

Furthermore, a base body that includes a ceramic material that represents a varistor ceramic based on ZnO—Bi or ZnO—Pr may be used in the method according to the present invention.

Referring now to the figures of the drawings in detail and first, particularly to FIG. 1A thereof, there is shown a base body 1 of an electrical component after step B) is performed. A template 5 has been positioned on the ceramic base body, the through holes 10 having been produced using stamping through the template 5, for example, the through holes 10 being able to be produced jointly in the template 5 and in the base body 1 using stamping, for example. The base body 1 may have different ceramic regions 1A and 1B in this case, such as different ceramic green films. In the case of a varistor component, the base body 1 may include ZnO—Bi. The template may be made of organic polymers of suitable rigidity, for example, from the class of polyphenylene sulfides (PPS) or polyethylene terephthalates (PET). To ensure good adhesive strength of the template on the ceramic base body, coatings based on silicones may also be applied to the template, for example.

Figure 1B:
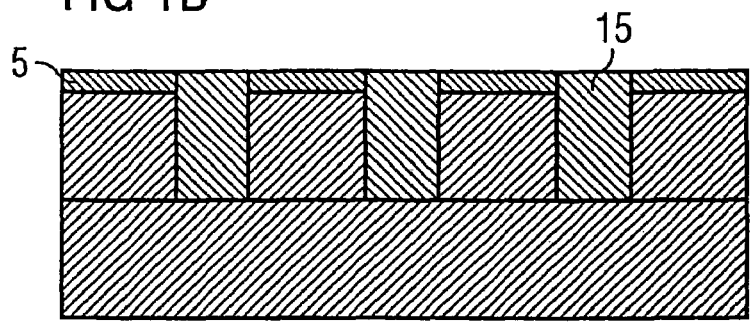
FIG. 1B is a diagrammatic, fragmentary, cross-sectional view of an electrical component after a further step of the method according to the present invention.

FIG. 1B is a diagrammatic cross-section through a component after step C) of the method according to the present invention. In such a case, an electrically conductive material was poured into the through holes 10 so that the surfaces of the fillers 15 are positioned at a higher level in the through holes than the surface of the base body. In such a case, for example, the template 5 is suitable for the purpose of retaining electrically conductive material located above the surface of the ceramic base body, so that the material may be poured into the through holes 10 up to above the surface of the base body especially easily. In such a case, for example, metal pastes of the compositions Ag90Pd10, Ag80Pd20, Ag70Pd30, and Ag60Pd40 may be used as the electrically conductive material as a function of the required sintering temperature (specific proportions in weight-percent).

Figure 1C:
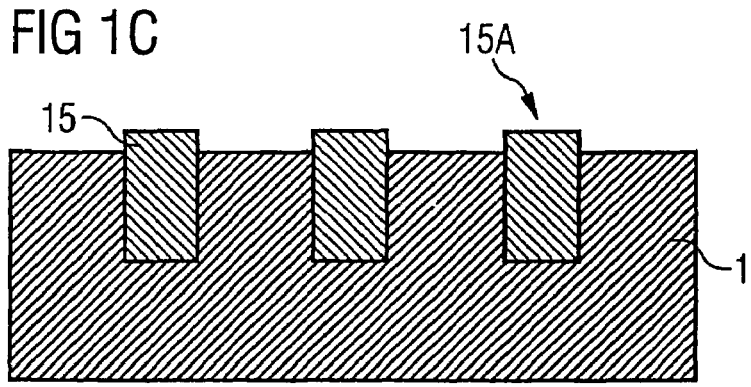
FIG. 1C is a diagrammatic, fragmentary, cross-sectional view of an electrical component after another step of the method according to the present invention.

FIG. 1C is a diagrammatic cross-section through a base body of an electrical component after step D) of the method according to the present invention. In step D), the ceramic green body was sintered for two to eight hours at temperatures between 1000° C. and 1200° C., for example. At the same time, the electrically conductive material in the through holes 10, the metal paste already mentioned above, was also hardened and/or sintered. The template 5, which is made of organic polymers, was vaporized by carbonization at these temperatures. Regions of the fillers 15 projecting above the surface of the base body remain in this case. These projecting regions may be wetted especially easily with solder, so that the bumps may be produced especially easily on the surfaces 15A of the fillers.

Figure 1D:
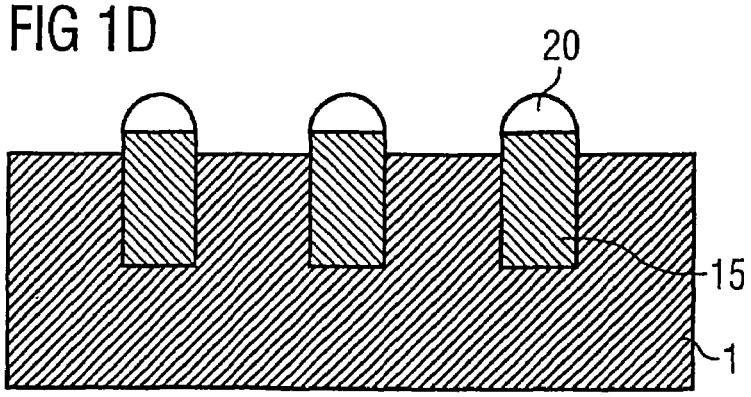
FIG. 1D is a diagrammatic, fragmentary, cross-sectional view of an electrical component after yet another step of the method according to the present invention.

FIG. 1D is a diagrammatic cross-section through the base body of a component after step E) of the method according to the present invention. For such a purpose, for example, the bumps 20 were produced on the surfaces 15A of the fillers 15 for four to twenty seconds using a solder bath that has a temperature of 215° C. to 260° C. The bumps may be made of Sn60Pb40, for example.

Figure 2:
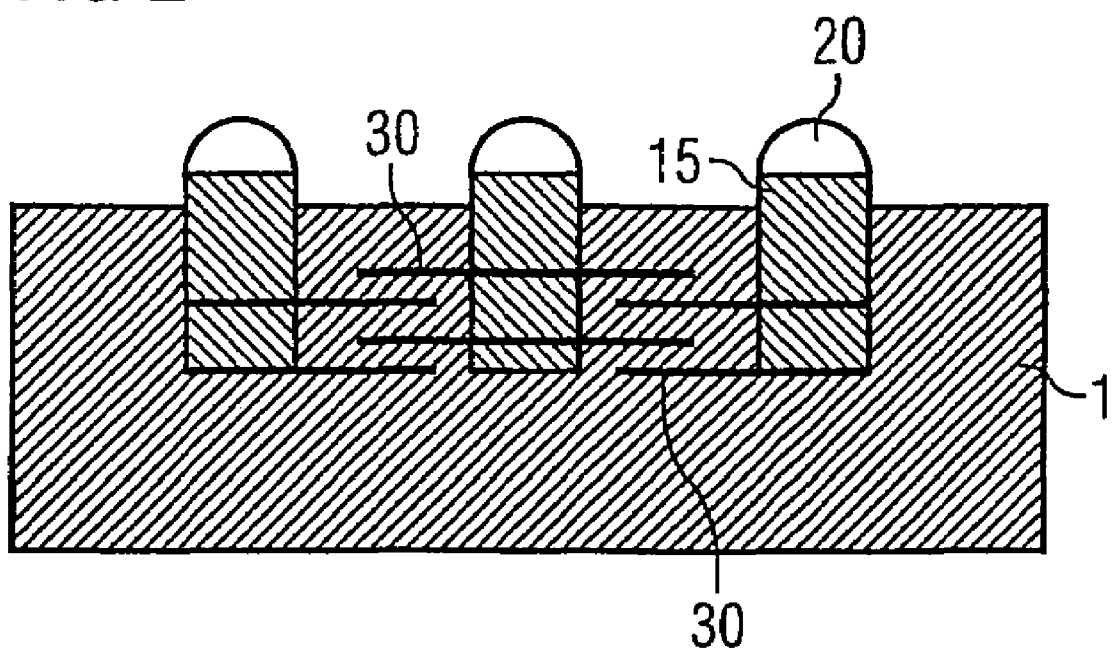
FIG. 2 is a diagrammatic, fragmentary, cross-sectional view of an electrical component manufactured using a method according to the present invention.

FIG. 2 is a diagrammatic cross-section of an electrical component having electrodes 30, the electrical contacts thereof were produced using the method according to the present invention. In such a case, the fillers 15 are used as electrical through contacts, which connect the internal electrodes 30 to the bumps 20 positioned on the surface of the component in an electrically conductive way.

We claim:

1. A method for producing electrical contacts in the form of bumps on an electrical component including a base body, the method which comprises:
    A) positioning a template on a surface of the base body of a ceramic material of the electrical component;
    B) producing through holes in the base body through the template, the through holes partially perforating the base body;
    C) filling the through holes with an electrically conductive material to a level higher than the surface of the base body to form fillers in the through holes;
    D) hardening the fillers to have surfaces of the fillers project out of the base body; and
    E) producing bumps directly on the surfaces of the fillers for an external electrical contact of the fillers.

2. The method according to claim 1, which further comprises:
    carrying out the positioning step by providing the template with openings; and
    carrying out the through hole producing step by producing the through holes in the base body through at least some of the openings of the template.

3. The method according to claim 1, which further comprises:
    carrying out the positioning step by providing the template with openings; and
    carrying out the through hole producing step by producing the through holes in the base body through the openings of the template.

4. The method according to claim 1, which further comprises:
    providing the base body of the electrical component as a ceramic green body; and
    carrying out the hardening step by simultaneously sintering the ceramic green body.

5. The method according to the claim 4, which further comprises carrying out the sintering of the green body at a temperature between approximately 1000° C. and approximately 1200° C.

6. The method according to claim 1, which further comprises providing the template of a polymer material.

7. The method according to claim 1, which further comprises carrying out the through hole producing step by stamping the through holes.

8. The method according to claim 1, which further comprises:
    prior to the positioning step, producing a plurality of electrode surfaces positioned at intervals with respect to one another in the base body, the electrode surfaces containing electrodes; and
    carrying out the filling and hardening steps to electrically conductively connect the fillers to the electrodes.

9. The method according to claim 8, which further comprises:
    producing the base body by stacking ceramic green films one on top of another; and
    producing the electrodes on individual ones of the ceramic green films.

10. The method according to claim 9, which further comprises carrying out the electrode producing step by printing the electrodes.

11. The method according to claim 1, which further comprises, after the hardening step and before the bump producing step, subjecting the surfaces of the fillers to at least one treatment process selected from the group consisting of mechanical and chemical treatments.

12. The method according to claim 11, which further comprises treating the surfaces of the fillers using mechanical processes selected from at least one of lapping and sandblasting.

13. The method according to claim 11, which further comprises treating the surfaces of the fillers with a chemical compound selected from at least one of the group consisting of acids and bases.

14. The method according to claim 1, which further comprises carrying out the filling step by filling the through holes with metal pastes selected from at least one of the group consisting of metals and metal alloys.

15. The method according to claim 1, which further comprises carrying out the filling step by filling the through holes with metal pastes selected from at least one of the group consisting of Pd, Pt, AgPd, AgPt, and AgPdPt.

16. The method according to claim 1, which further comprises carrying out the bump producing step by producing the bumps galvanically.

17. The method according to claim 1, which further comprises carrying out the bump producing step by bringing the fillers into contact with a solder bath.

18. The method according to claim 1, which further comprises carrying out the bump producing step by producing the bumps from metals and metal alloys selected from at least one of the group consisting of Sn, SnPb, SnAgCu, SnAgCuBi, SnZn, and SnAg.

19. The method according to claim 1, which further comprises providing the base body of a ceramic material selected from at least one of the group consisting of ferrites, ZnO—Bi, ZnO—Pr, NPO ceramics, doped BaTiO3, nickel-manganese spinel, and perowskite.

20. A method for producing electrical contacts on an electrical component including a base body, the method which comprises:
    first, positioning a template on a surface of the base body of a ceramic material;
    second, producing through holes in the base body through the template, the through holes partially perforating the base body;
    third, forming fillers in the through holes by filling the through holes with an electrically conductive material to a level higher than the surface of the base body;
    fourth, hardening the fillers to have filler surfaces project out of the base body; and
    fifth, producing bumps directly on the projecting filler surfaces for externally electrically contacting the fillers.

21. A method for producing electrical contacts on an electrical component, the method which comprises:
    first, providing the electrical component with a base body of a ceramic green body;

second, producing a plurality of electrode surfaces positioned at intervals with respect to one another in the base body, the electrode surfaces containing electrodes;

third, positioning a polymer template having openings on a surface of the base body;

fourth, producing through holes in the base body through at least some of the openings of the template, the through holes partially perforating the base body;

fifth, forming fillers in the through holes by filling the through holes with an electrically conductive material to a level higher than the surface of the base body and electrically conductively connecting the fillers to the electrodes;

sixth, hardening the fillers to have filler surfaces project out of the base body and simultaneously sintering the ceramic green body; and seventh, producing bumps directly on the projecting filler surfaces for externally electrically contacting the fillers.

* * * * *